United States Patent
Rae et al.

(10) Patent No.: US 11,095,289 B2
(45) Date of Patent: Aug. 17, 2021

(54) TIME OF FLIGHT SENSING UNIT HAVING RECONFIGURABLE OR LOGIC

(71) Applicant: STMicroelectronics (Research & Development) Limited, Marlow (GB)

(72) Inventors: Bruce Rae, Edinburgh (GB); Neale Dutton, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 1128 days.

(21) Appl. No.: 15/588,127

(22) Filed: May 5, 2017

(65) Prior Publication Data

US 2018/0323788 A1 Nov. 8, 2018

(51) Int. Cl.
*G01C 3/08* (2006.01)
*H03K 19/17764* (2020.01)
*H03K 19/20* (2006.01)
*H04N 5/225* (2006.01)

(52) U.S. Cl.
CPC ....... *H03K 19/17764* (2013.01); *H03K 19/20* (2013.01); *H04N 5/2256* (2013.01)

(58) Field of Classification Search
CPC . H03K 19/17764; H03K 19/20; H04N 5/2256
See application file for complete search history.

(56) References Cited

U.S. PATENT DOCUMENTS

| 5,355,165 | A | * | 10/1994 | Kosonocky | .......... | H04N 5/3728 348/311 |
| 7,764,396 | B2 | * | 7/2010 | Yu | .......................... | H04N 5/379 358/1.2 |
| 2014/0070867 | A1 | | 3/2014 | Dutton | | |
| 2014/0231630 | A1 | | 8/2014 | Rae et al. | | |
| 2014/0354778 | A1 | * | 12/2014 | Kolar | ....................... | G06T 1/20 348/46 |
| 2015/0041625 | A1 | | 2/2015 | Dutton et al. | | |
| 2016/0291138 | A1 | | 10/2016 | Drader et al. | | |

* cited by examiner

*Primary Examiner* — Samantha K Nickerson
(74) *Attorney, Agent, or Firm* — Crowe & Dunlevy

(57) ABSTRACT

An electronic device includes at least one photodetection block, where the at least one photodetection block includes a plurality of macropixels arranged into an array. Each macropixel includes an array of photodiodes, with logic circuitry coupled to outputs of the array of photodiodes and configured to generate a detection signal as a function of logically combining the outputs of the array of photodiodes. Each macropixel has associated therewith selection circuitry configured to selectively pass the detection signal to output combining logic or to output combining logic of at least one neighboring macropixel of the plurality thereof. The output combining logic has inputs coupled to the selection circuitry and to the selection circuitry of the at least one neighboring macropixel, and is configured to generate an output detection signal as a function of logically combining outputs of the selection circuitry and the selection circuitry of the at least one neighboring macropixel.

22 Claims, 9 Drawing Sheets

TIME OF FLIGHT SENSING UNIT HAVING RECONFIGURABLE OR LOGIC

TECHNICAL FIELD

This application is related to the field of time of flight sensing, and more particularly, to the use of reconfigurable OR logic to compensate for slight manufacturing defects.

BACKGROUND

Time of flight ranging systems are now used in a variety of commercial and consumer products. A typical time of flight ranging system includes a ranging light emitter, such as a laser, that emits pulses of light. This light travels toward a target, and some of the light reflects off the target surface and returns to the time of flight ranging system where it is detected by a reflected light detector. Since the speed of light is known, by precisely measuring the elapsed time between emission of the light and detection of the reflected light, the distance between the time of flight ranging system and the target can be determined.

The reflected light detector commonly includes an array of single photon avalanche diodes (SPADs) carried in a housing, with a lens positioned over the array of SPADs to focus or guide the reflected light onto the SPADs. Due to manufacturing irregularities, the lens may not be perfectly positioned over the array of SPADs. Thus, reflected light may not reach some of the SPADs.

However, conventional arrays of SPADs lack any mechanism to compensate or adjust operation for this, leading to an undesirable and potentially costly penalty in terms of manufacturing yield. Therefore, further development in this area is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is an electronic device including at least one photodetection block, where the at least one photodetection block includes a plurality of macropixels arranged into an array. Each macropixel itself includes an array of photodiodes, with logic circuitry coupled to outputs of the array of photodiodes and configured to generate a detection signal as a function of logically combining the outputs of the array of photodiodes. Each macropixel has associated therewith selection circuitry configured to selectively pass the detection signal to output combining logic or to output combining logic of at least one neighboring macropixel of the plurality thereof. The output combining logic has inputs coupled to the selection circuitry and to the selection circuitry of the at least one neighboring macropixel, and is configured to generate an output detection signal as a function of logically combining outputs of the selection circuitry and the selection circuitry of the at least one neighboring macropixel.

A multiplexing circuit may be coupled to receive the output detection signal generated by the output combining logic of each macropixel as input, and to pass at least one of the output detection signals as output. The logic circuitry may include OR logic circuitry configured to receive outputs of the array of photodiodes as input, and generate the detection signal as a function of a logic OR operation between the outputs of the array of photodiodes. The selection circuitry may include a first AND gate coupled to receive the detection signal and a first control signal, and providing output to the output combining logic, and a second AND gate coupled to receive the detection signal and a second control signal, and providing output to the output combining logic of the at least one neighboring macropixel. Assertion of the first control signal may indicate that the detection signal is to be passed to the output combining logic, and assertion of the second control signal may indicate that the detection signal is to be passed to the output combining logic of the at least one neighboring macropixel.

The output combining logic may have inputs coupled to the selection circuitry, to the selection circuitry of a neighboring macropixel to the left, and to the selection circuitry of a neighboring macropixel to the right, and may be configured to generate an output detection signal as a function of logically combining outputs of the selection circuitry, the selection circuitry of the neighboring macropixel to the left, and the selection circuitry of the neighboring macropixel to the right.

The selection circuitry may include a first AND gate coupled to receive the detection signal and a first control signal, and providing output to the output combining logic, and a second AND gate coupled to receive the detection signal and a second control signal, and providing output to the output combining logic of the neighboring macropixel to the left. A third AND gate may be coupled to receive the detection signal and a third control signal, and may provide output to the output combining logic of the neighboring macropixel to the right. Assertion of the first control signal may indicate that the detection signal is to be passed to the output combining logic, assertion of the second control signal may indicate that the detection signal is to be passed to the output combining logic of the neighboring macropixel to the left, and assertion of the third control signal may indicate that the detection signal is to be passed to the output combining logic of the neighboring macropixel to the right.

The output combining logic may include OR logic circuitry configured to receive outputs of the first AND gate, the selection circuitry of the neighboring macropixel to the left, and the selection circuitry of the neighboring macropixel to the right, and to generate the output detection signal as a function of a logic OR operation between the outputs of the first AND, the selection circuitry of the neighboring macropixel to the left, and the selection circuitry of the neighboring macropixel to the right.

The output combining logic may have inputs coupled to the selection circuitry, to the selection circuitry of a neighboring macropixel above, and to the selection circuitry of a neighboring macropixel below, and may be configured to generate an output detection signal as a function of logically combining outputs of the selection circuitry, the selection circuitry of the neighboring macropixel above, and the selection circuitry of the neighboring macropixel below.

The selection circuitry may include a first AND gate coupled to receive the detection signal and a first control signal, and providing output to the output combining logic. The selection circuitry may also include a second AND gate coupled to receive the detection signal and a second control signal, and providing output to the output combining logic of the neighboring macropixel above. The selection circuitry may also include a third AND gate coupled to receive the detection signal and a third control signal, and providing output to the output combining logic of the neighboring macropixel below. Assertion of the first control signal may indicate that the detection signal is to be passed to the output combining logic, assertion of the second control signal may indicate that the detection signal is to be passed to the output combining logic of the neighboring macropixel above, and assertion of the third control signal may indicate that the detection signal is to be passed to the output combining logic of the neighboring macropixel below.

The output combining logic may include OR logic circuitry configured to receive outputs of the first AND gate, the selection circuitry of the neighboring macropixel above, and the selection circuitry of the neighboring macropixel below, and may be configured to generate the output detection signal as a function of a logic OR operation between the outputs of the first AND, the selection circuitry of the neighboring macropixel above, and the selection circuitry of the neighboring macropixel below.

The selection circuitry may include horizontal selection circuitry configured to selectively pass the detection signal to the output combining logic or to output combining logic of at least one horizontally neighboring macropixel of the plurality thereof, and vertical selection circuitry configured to selectively pass the detection signal to the output combining logic or to output combining logic of at least one vertically neighboring macropixel of the plurality thereof.

The output combining logic may include horizontal combining logic having inputs coupled to the selection circuitry and to the selection circuitry of the at least one horizontally neighboring macropixel, and may be configured to generate an output detection signal as a function of logically combining outputs of the selection circuitry and the selection circuitry of the at least one horizontally neighboring macropixel. Vertical combining logic may have inputs coupled to the selection circuitry and to the selection circuitry of the at least one vertically neighboring macropixel, and may be configured to generate an output detection signal as a function of logically combining outputs of the selection circuitry and the selection circuitry of the at least one vertically neighboring macropixel.

A multiplexing circuit may be coupled to receive the output detection signal generated by the vertical combining logic of each macropixel as input, and to pass at least one of those output detection signals as output.

The at least one photodetection block may include an array of photodetection blocks. The vertical selection circuitry of each macropixel may be physically located at a periphery of the array of photodetection blocks. The horizontal selection circuitry of each macropixel may not physically located at a periphery of the array of photodetection blocks.

The at least one photodetection block may include an array of photodetection blocks, and the selection circuitry and output combining circuitry may be physically located at a periphery of the array of photodetection blocks.

DETAILED DESCRIPTION

One or more embodiments of the present disclosure will be described below. These described embodiments are only examples of the presently disclosed techniques. Additionally, in an effort to provide a concise description, some features of an actual implementation may not be described in the specification. When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements.

Figure 1:
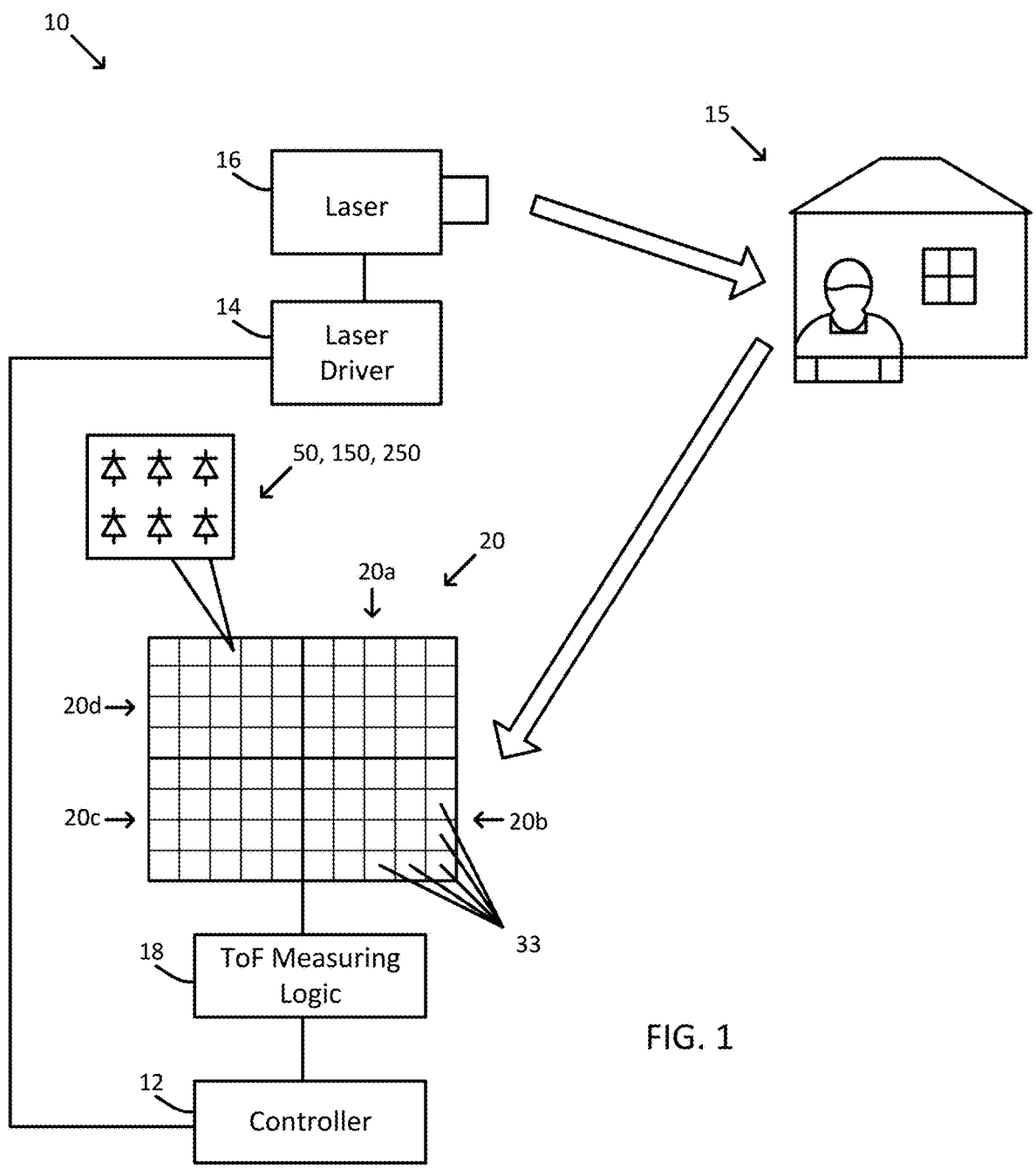
FIG. 1 is a block diagram of a time of flight ranging system in accordance with the disclosures herein
Figure 2:
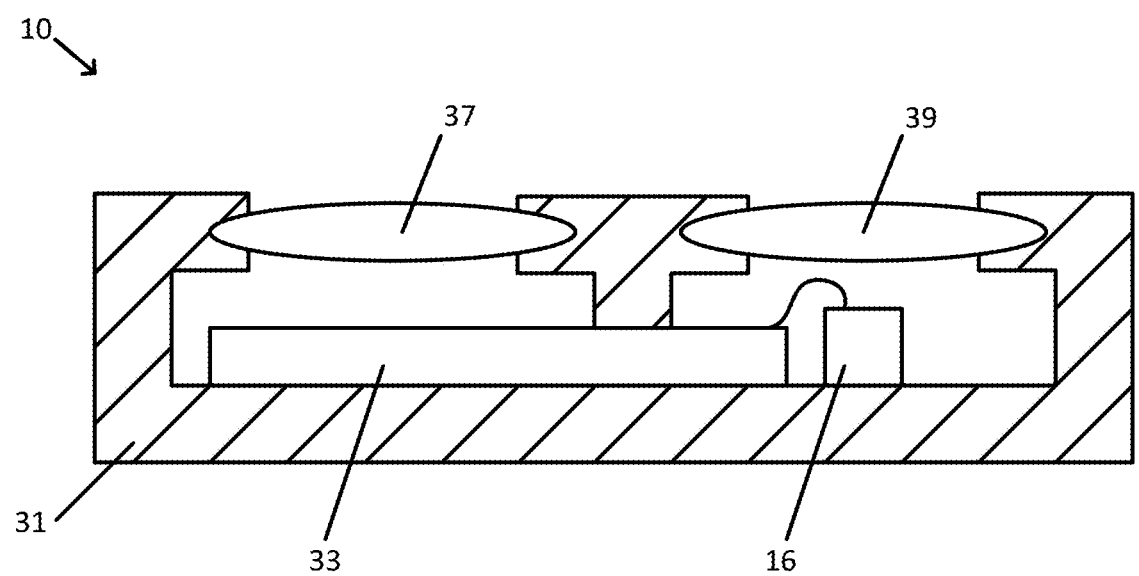
FIG. 2 is a cutaway view of the array of macropixels of the time of flight ranging system of FIG. 1.

With initial reference to FIGS. 1-2, a time of flight (TOF) ranging system 10 is now described. The TOF ranging system 10 includes one or more lasers 16 as a ranging light source, which may be a vertical cavity surface emitting laser (VCSEL). The laser 16 is driven by a laser driver 14, which is actuated by a controller 12. When activated, the laser 16 emits pulses of laser light, which travel to and are reflected off objects in a scene 15.

The TOF ranging system 10 also includes a reflected light detector 20. The reflected light detector 20 illustratively includes four photodetection zones 20a-20d, each of which is comprised of an array of macropixels 33. Each of the macropixels 50, 150, 250 itself is comprised of an array of phododiodes, such as single photon avalanche diodes, which detects the ranging light that has been reflected from the scene 15.

It should be understood that the reflected light detector 20 may have any number of photodetection zones 20a-20d, and that each array of macropixels 33 may have any number of macropixels 50, 150, 250 in it. Moreover, each macropixel 50, 150, 250 may have any number of photodiodes in it.

TOF measuring logic 18 monitors the output of the reflected light detector 20, and determines the distance to objects in the scene 15 based upon the time elapsed between activating the laser 16 and detecting the reflected ranging light.

By assembling the counts of detected reflected light at the various macropixels 50, 150, 250 of each photodetection zone 20a-20d, a map or histogram of distances to different objects, or different portions of a given object, in the scene 15 can be determined.

As can be seen in FIG. 2, each array of macropixels 33 is positioned within a package 31, as is a laser 16. The emitted ranging light exits the package 31 through the lens 39, and reflected light enters the package 31 through the lens 37.

However, due to slight manufacturing errors or misalignments, some of the macropixels 50, 150, 250 might not be positioned to receive reflected light. For example, lens 37 may be slightly misaligned, such that some of the reflected light does not reach some of the macropixels 50, 150, 250.

This misalignment could therefore result in inaccurate ranging data being determined by the TOF ranging system 10. Since this is undesirable, the Inventors have developed the following advances and built them into the TOF ranging system 10.

Figure 3:
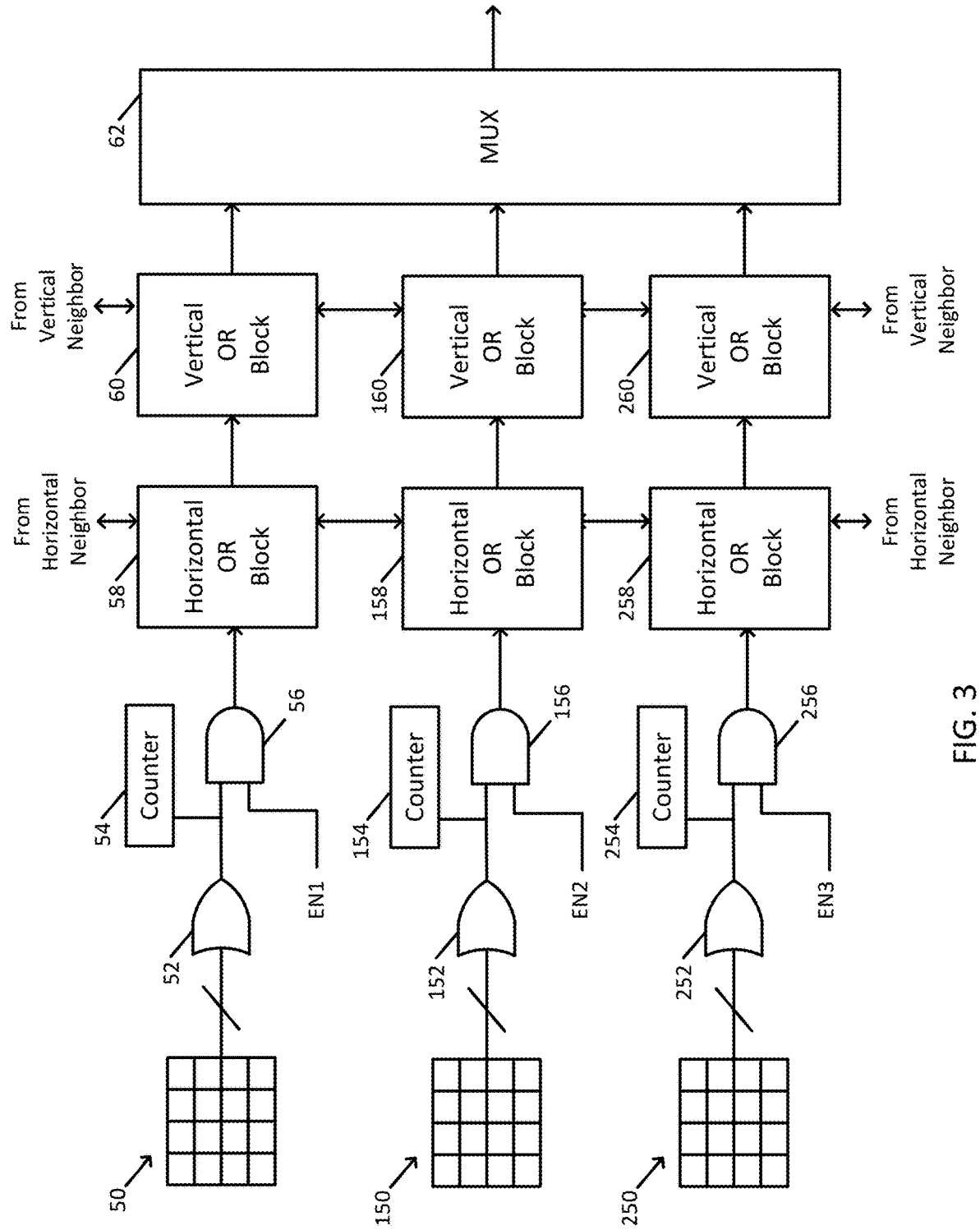
FIG. 3 is a block diagram showing the logic circuitry associated with the macropixels of the time of flight ranging system of FIG. 1.

Referring now to FIG. 3, an example showing three macropixels 50, 150, 250 and their associated logic circuitry is shown. The macropixel 50 is illustratively shown as an array of 4×4 photodiodes. The outputs of each photodiode of the macropixel 50 are fed to OR gate 52. The output of OR gate 52 is fed to the in-pixel counter 54, and to the input of AND gate 56. Also fed to the input of AND gate 56 is enable signal EN1. The output of AND gate 56 is fed to horizontal OR block 58, and in turn the output of horizontal OR block 58 is fed to vertical OR block 60.

Similarly, the macropixel 150 is an array of 4×4 photodiodes. The outputs of each photodiode of the macropixel 150 are fed to OR gate 152. The output of OR gate 152 is fed to the in-pixel counter 154, and to the input of AND gate 156. Also fed to the input of AND gate 156 is enable signal EN2. The output of AND gate 156 is fed to horizontal OR block 158, and in turn the output of horizontal OR block 158 is fed to vertical OR block 160.

Likewise, the macropixel 250 is an array of 4×4 photodiodes. The outputs of each photodiode of the macropixel 250 are fed to OR gate 252. The output of OR gate 252 is fed to the in-pixel counter 254, and to the input of AND gate 256. Also fed to the input of AND gate 256 is enable signal EN3. The output of AND gate 256 is fed to horizontal OR block 258, and in turn the output of horizontal OR block 258 is fed to vertical OR block 160.

The outputs of the vertical OR blocks 60, 160, and 260 are fed to the multiplexing circuitry 62, which passes one or more of the signals received therefrom as output.

Figure 4:
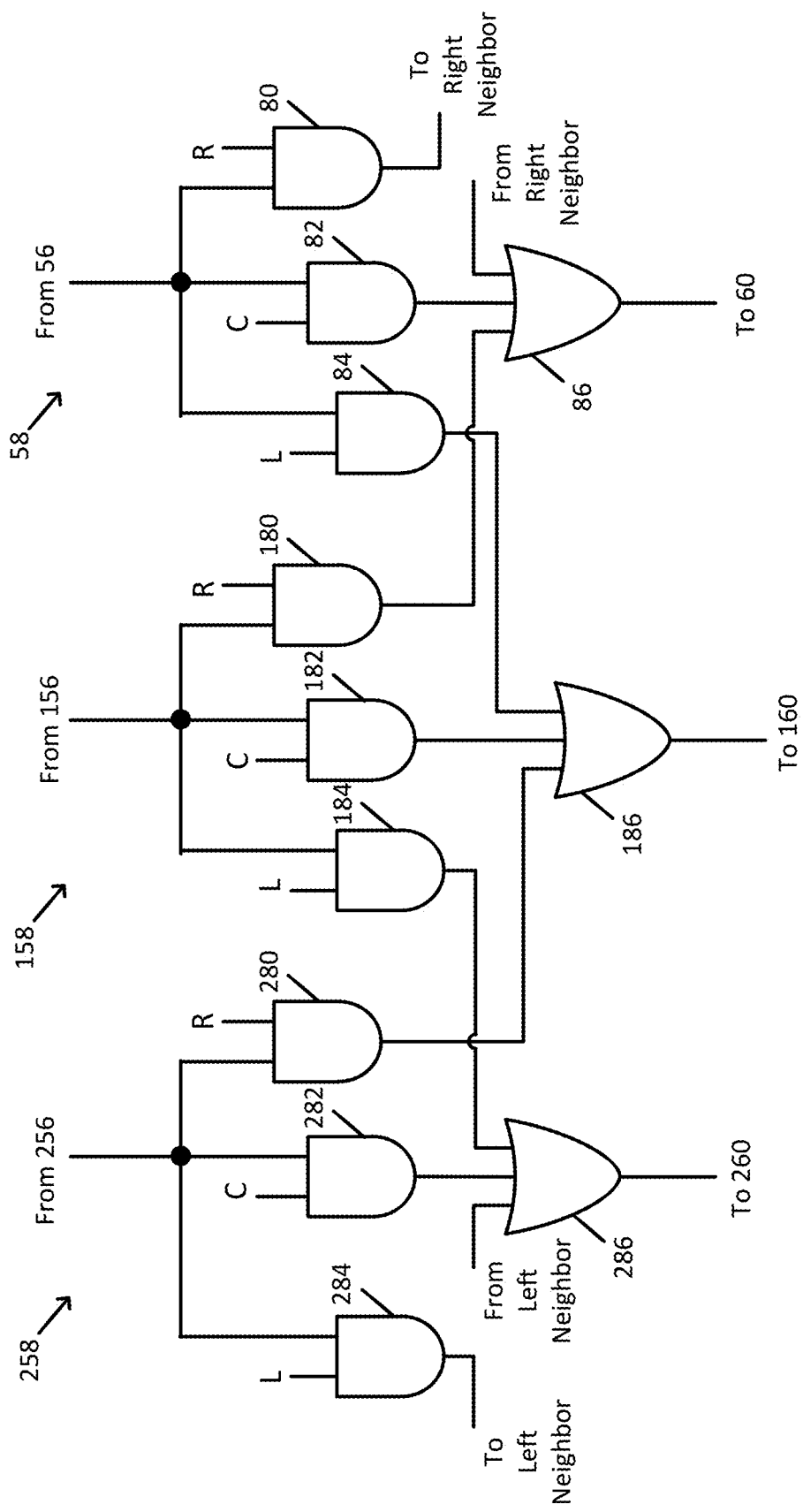
FIG. 4 is a schematic showing the logic circuits of the horizontal OR circuitry of FIG. 3.

The horizontal OR blocks 58, 158, 258 are shown in greater detail in FIG. 4. Here, as illustrated, the horizontal OR block 58 includes AND gate 80 receiving input from AND gate 56, and a control signal R. The AND gate 80 provides output to a rightward neighbor not shown. AND gate 82 receives input from AND gate 56, and a control signal C, and provides output to OR gate 86. AND gate 84 receives input from AND gate 56, and a control signal L, and provides output to OR gate 186 of horizontal OR block 158.

Similarly, horizontal OR block 158 includes AND gate 180 receiving input from AND gate 156, and a control signal R. The AND gate 180 provides output to OR gate 86. AND gate 182 receives input from AND gate 156, and a control signal C, and provides output to OR gate 186. AND gate 184 receives input from AND gate 156, and a control signal L, and provides output to OR gate 286 of horizontal OR block 258.

Likewise, horizontal OR block 258 includes AND gate 280 receiving input from AND gate 256, and a control signal R. The AND gate 280 provides output to OR gate 186. AND gate 282 receives input from AND gate 256, and a control signal C, and provides output to OR gate 286. AND gate 284 receives input from AND gate 256, and a control signal L, and provides output to a leftward neighbor not shown.

The control signals L, R, and C stand for left shift, right shift, or center. These control signals are generated by the controller 12. Dependent on which of these control signals are asserted, the inputs from AND gates 56, 156, 256 are selectively shifted to different OR gates 86, 186, 286 by being passed or blocked by the AND gates 80, 82, 84, 180, 182, 184, 280, 282, 284. Thus, the control signals L, R, and C serve to select to which OR gate 86, 186, 286 the output of a given macropixel is sent.

Figure 5:
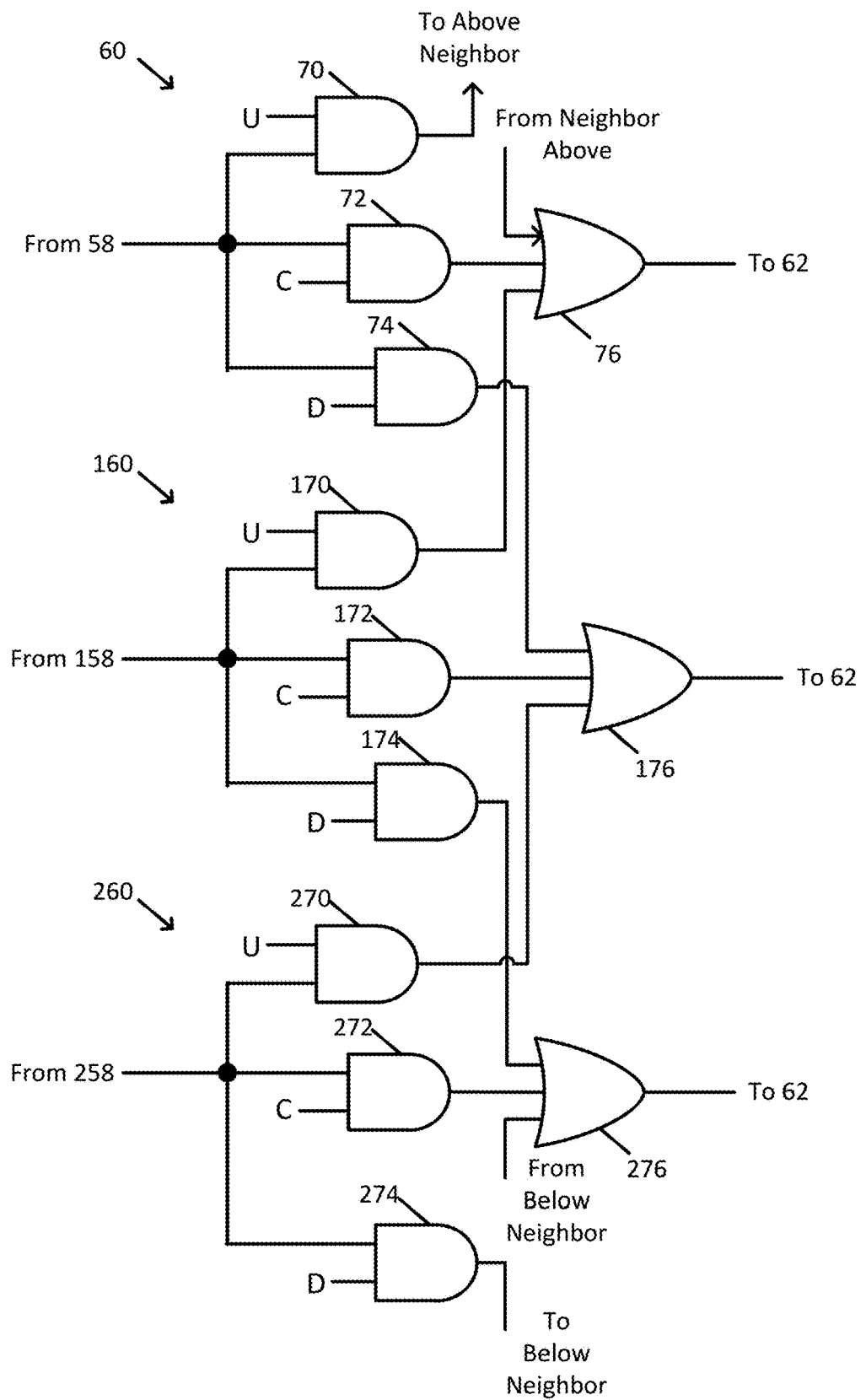
FIG. 5 is a schematic showing the logic circuits of the vertical OR circuitry of FIG. 3.

The vertical OR blocks 60, 160, 260 are shown in greater detail in FIG. 5. The vertical OR block 60 includes AND gate 70 receiving input from the OR gate 86 of the horizontal OR block 58 and a control signal U, and provides its output to a vertically upward neighbor not shown. AND gate 72 also receives input from the OR gate 86 of the horizontal OR block 58 and a control signal C, and provides its output to OR gate 76. AND gate 74 receives input from the OR gate 86 of the horizontal OR block 58 and a control signal D, and provides its output to OR gate 176 of vertical OR block 160.

The vertical OR block 160 includes AND gate 170 receiving input from the OR gate 186 of the horizontal OR block 158 and a control signal U, and provides its output to OR gate 76 of vertical OR block 60. AND gate 172 also receives input from the OR gate 186 of the horizontal OR block 158 and a control signal C, and provides its output to OR gate 176. AND gate 174 receives input from the OR gate 186 of the horizontal OR block 158 and a control signal D, and provides its output to OR gate 276 of vertical OR block 260.

The vertical OR block 260 includes AND gate 270 receiving input from the OR gate 286 of the horizontal OR block 258 and a control signal U, and provides its output to OR gate 176 of vertical OR block 160. AND gate 272 also receives input from the OR gate 286 of the horizontal OR block 258 and a control signal C, and provides its output to OR gate 276. AND gate 274 receives input from the OR gate 286 of the horizontal OR block 258 and a control signal D, and provides its output to a vertically lower neighbor.

The control signals U, D, and C stand for shift up, shift down, or center, respectively. They serve to select to which OR gate 76, 176, 276 the output of a given macropixel is sent. These control signals are generated by the controller 12. Dependent on which of these control signals are asserted, the inputs from OR gates 86, 186, 286 are selectively shifted to different OR gates 76, 176, 276 by being passed or blocked by the AND gates 70, 72, 74, 170, 172, 174, 270, 272, 274. Thus, the control signals U, D, and C serve to select to what OR gate the output of a given macropixel is sent.

Operation of the TOF ranging system 10 when detecting reflected ranging light is now described. Reflected ranging light impinges upon the macropixels 50, 150, 250. OR gates 52, 152, 252 logically combine the outputs of each photodiode of their respective macropixels 50, 150, 250. The enable signals EN1, EN2, EN3 and the AND gates 56, 156, 256 serve to either enable, or block, passage of the output of the OR gates 52, 152, 252.

The horizontal OR blocks 58, 158, 258 function to select which horizontally neighboring macropixels have their outputs logically OR'd together. Similarly, the vertical OR blocks 60, 160, 260 function to select which vertically neighboring macropixels have their outputs logically OR'd together.

Figure 6:
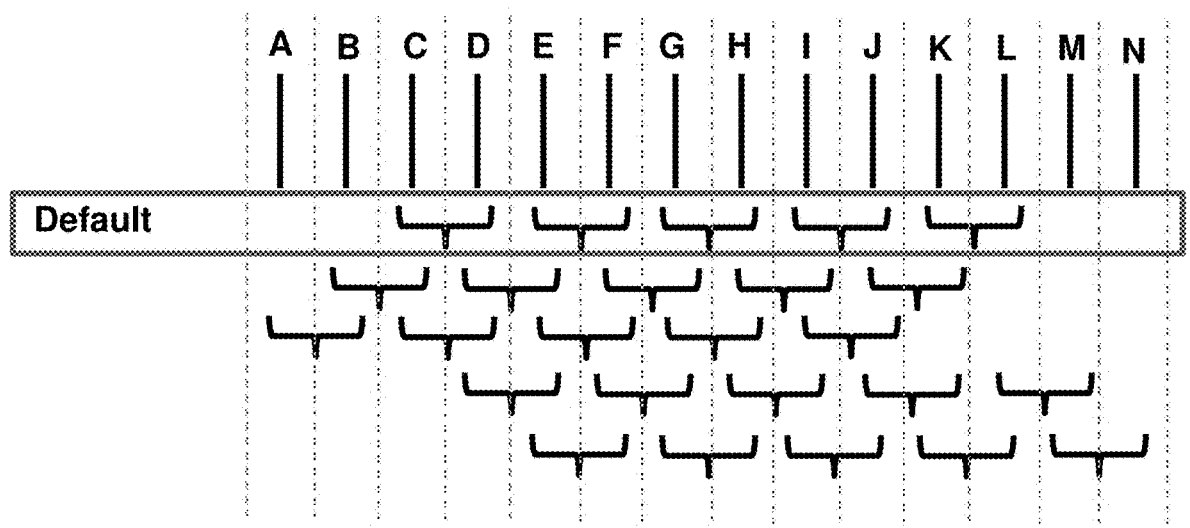
FIG. 6 is a diagram showing the shifting function performed by the horizontal and vertical OR circuitry of FIGS. 4-5.

The diagram shown in FIG. 6 helps explain this. In this example, there are macropixels A-N, and through different configurations of the horizontal OR blocks 58, 158, 258, which of those macropixels A-N are logically combined through an OR operation can be changed.

The net effect of this operation of the horizontal OR blocks 58, 158, 258 and vertical OR blocks 60, 160, 260 function together to shift the active area of the array of macropixel 33, allowing for adjustment to match the placement or misplacement of the lens 37.

Optional multiplexer 62 can choose which of the macropixels 50, 150, 250, or arrays of macropixels 33, are sent to further processing circuitry for use in determining time of flight. This multiplexer 62, in conjunction with the horizontal OR blocks 58, 158, 258 and vertical OR blocks 60, 160, 260 can also be used to reconfigure the overall number of photodetection zones 20a-20d by changing the size of each photodetection zone. Thus, the field of view of the reflected light detector 20 can be reconfigured for any desired reason.

Figure 7:
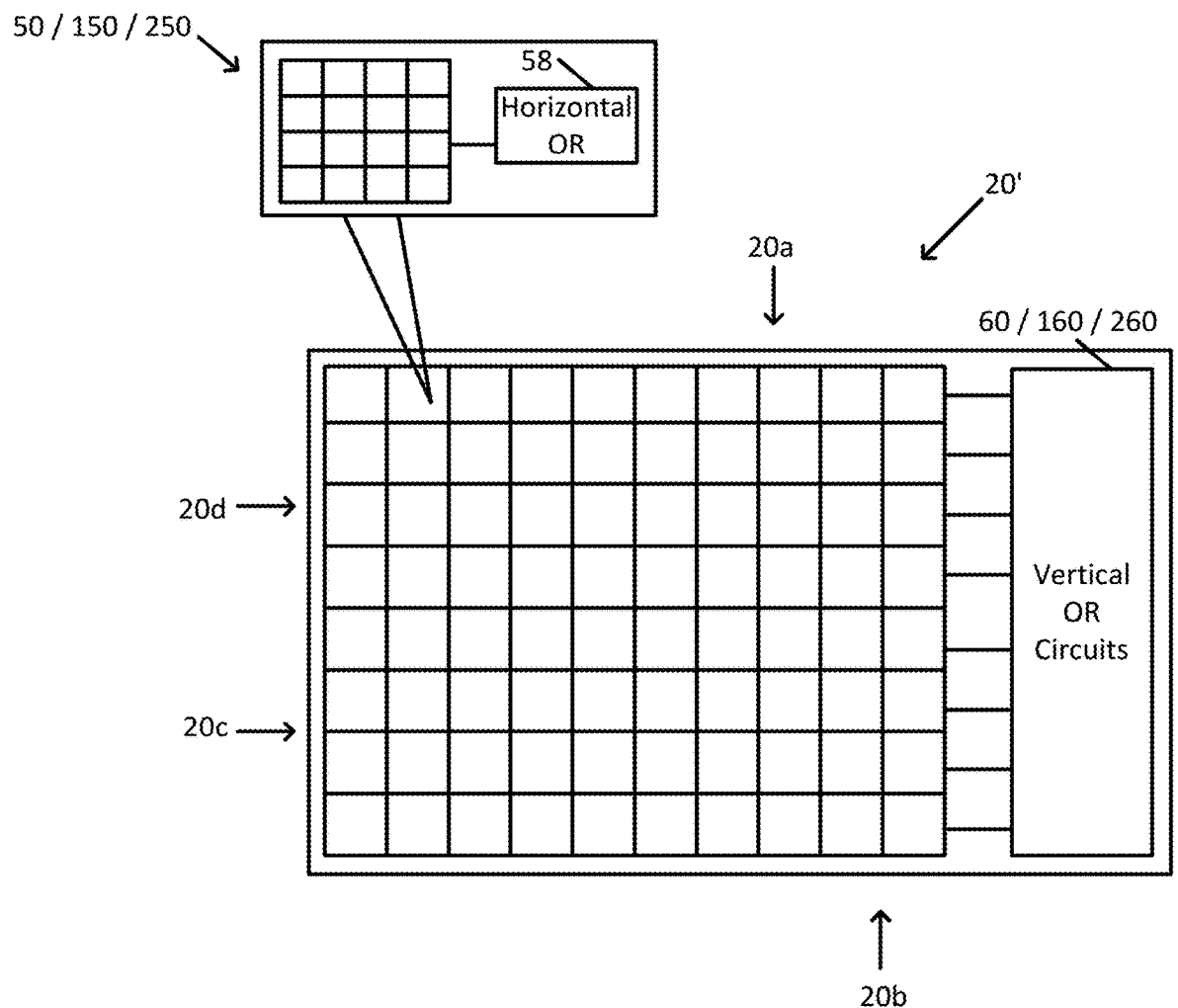
FIG. 7 is a top plan view of the layout of the array of macropixels of the time of flight ranging system of FIG. 1 in which the horizontal OR circuitry is within each macropixel but the vertical OR circuitry is at a periphery of the array of macropixels.

Packaging considerations are now discussed. In some instances, such as that shown in FIG. 7, the reflected light detector 20' may have the horizontal OR blocks 58, 158, 258 positioned within their respective macropixel 50, 150, 250 packages, while the vertical OR blocks 60, 160, 260 are instead positioned at a periphery of the reflected light detector 20' itself.

Figure 8:
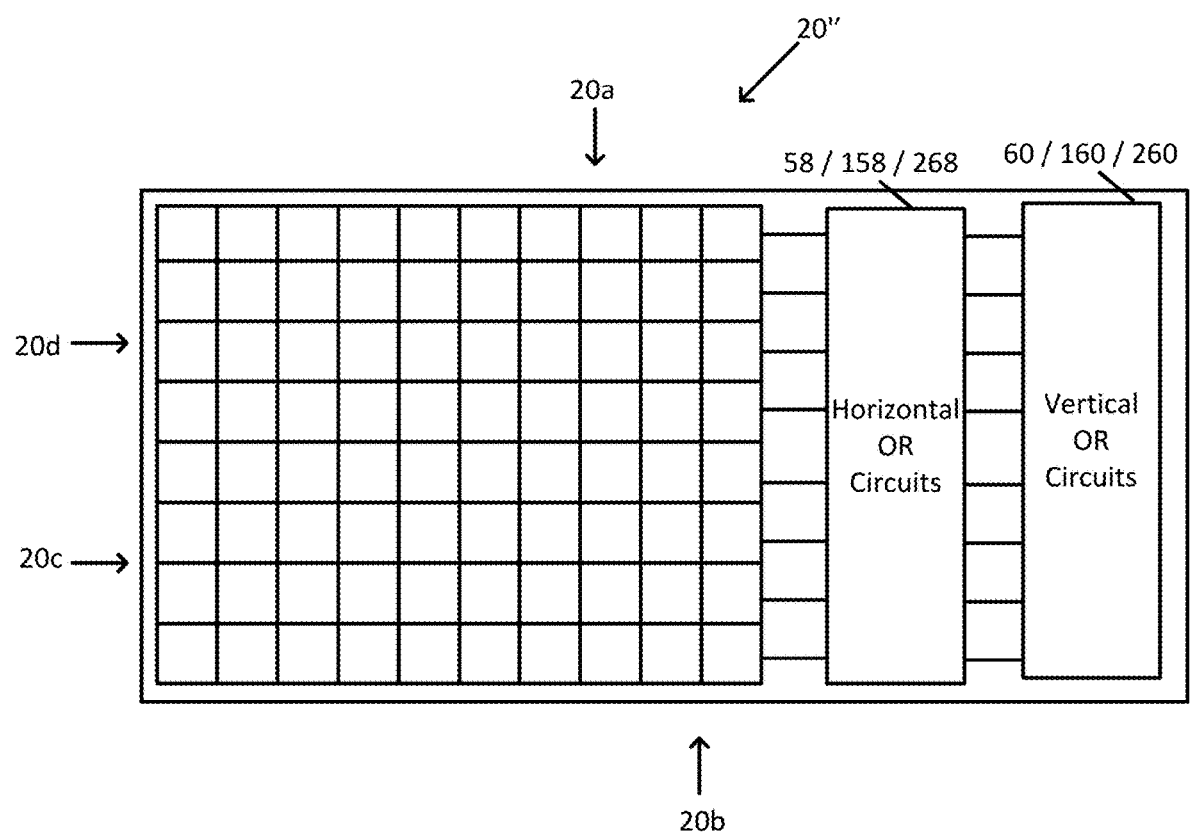
FIG. 8 is a top plan view of the layout of the array of macropixels of the time of flight ranging system of FIG. 1 in which both the horizontal and vertical OR circuitry is at a periphery of the array of macropixels.

In other instances, such as that shown in FIG. 8, the reflected light detector 20" may have both the horizontal OR blocks 58, 158, 258 and the vertical OR blocks 60, 160, 260 positioned at a periphery of the reflected light detector 20" itself. Compared to the packaging of FIG. 7, this embodiment of the reflected light detector 20" has an increased number of routes or lines run to its periphery.

It should be appreciated that the TOF ranging system need not include both horizontal OR blocks 58, 158, 258 and vertical OR blocks 60, 160, 260, and may instead have one or the other. Moreover, although the OR gates 52, 152, 252 and 76, 176, 276 are shown as having three inputs, it should be appreciated that these OR gates may have any number of inputs so as to permit combining of outputs from any number of macropixels.

Figure 9:
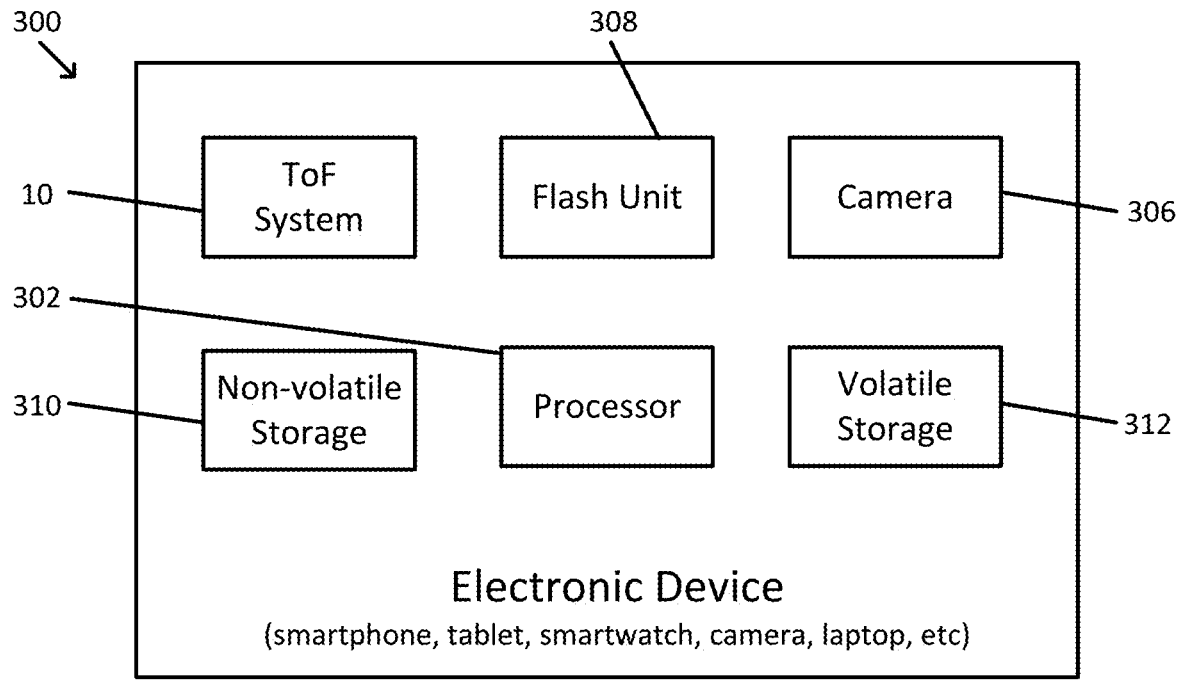
FIG. 9 is a block diagram of an electronic device incorporating the time of flight ranging system of these disclosures.
Figure 10:
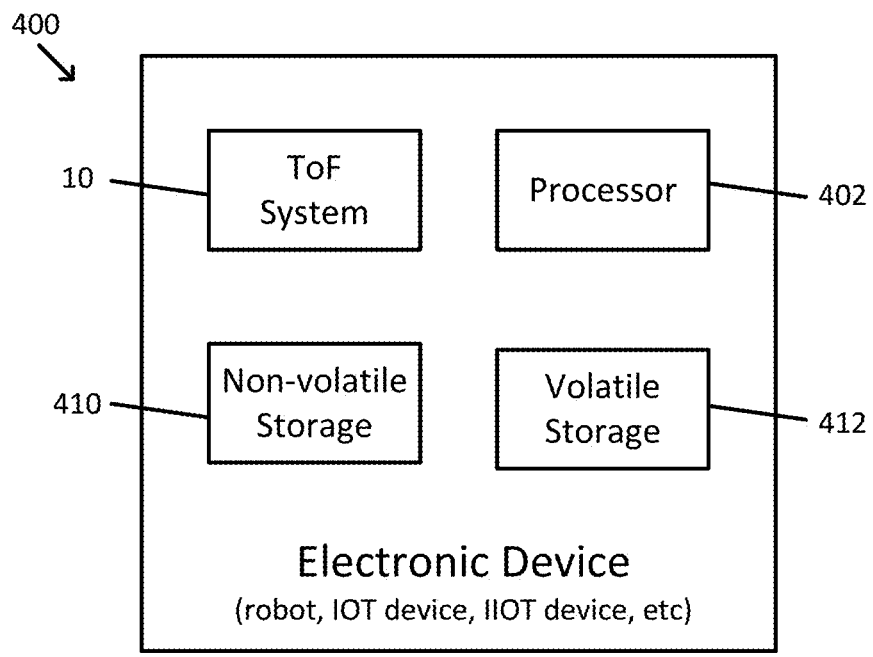
FIG. 10 is a block diagram of another electronic device incorporating the time of flight ranging system of these disclosures.

The uses of this TOF ranging system 10 are numerous. For example, the time of flight ranging system 10 may be incorporated within an electronic device 300 such as a smartphone, tablet, smartwatch, camera, or laptop as shown in FIG. 9. The electronic device 300 includes a processor 302, non-volatile storage 310, volatile storage 312, camera 306, and flash 308 for the camera. The TOF ranging system 10 may be used to determine the distance to various objects in a scene, or different points of an object in a scene, and the processor 302 may use this information to adjust the focus of the camera 306. Thus, the TOF ranging system 10 may be used in autofocus of the camera 306. In some cases, the distances to different objects, or different points of objects, in a scene as determined by the TOF ranging system 10 may be used by the processor 302 in processing images taken by the camera 306 to create depth of field effects, for example.

In other cases, the TOF ranging system 10 may be used alone, or in conjunction with the camera 306, to determine information about the environment in which the electronic device 300 resides, such as making a three dimensional map of the environment. This may be useful in augmented reality applications.

It should be understood that the TOF ranging system 10 may be used by the processor 302 for any suitable use, and all such uses are within contemplation of this disclosure.

The TOF ranging system 10 may be incorporated within an electronic device 400 such as a robot, internet of things device (light bulb, proximity sensor, or any connected device), or industrial internet of things device. Such electronic device 400 may include a processor 402, non-volatile storage 410, and volatile storage 412. In these devices, the TOF ranging system 10 may be used for proximity sensing, or for machine vision by a robot, for example.

It should be understood that the TOF ranging system 10 may be used by the processor 402 for any suitable use, and all such uses are within contemplation of this disclosure.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
   at least one photodetection block;
   wherein the at least one photodetection block comprises a plurality of macropixels arranged into an array, each macropixel comprising:
   a two-dimensional array of photodiodes; and
   OR circuitry dedicated to that macropixel and configured to receive only outputs of the two-dimensional array of photodiodes of that macropixel as input and configured to generate a detection signal as a function of a logic OR operation between the outputs of the two-dimensional array of photodiodes;
   wherein each macropixel has associated therewith:
   output combining logic; and
   selection circuitry configured to selectively pass the detection signal to the output combining logic or to output combining logic of at least one neighboring macropixel of the plurality thereof;
   wherein the output combining logic has inputs coupled to the selection circuitry and to the selection circuitry of the at least one neighboring macropixel, and is configured to generate an output detection signal as a function of logically combining outputs of the selection circuitry and the selection circuitry of the at least one neighboring macropixel.

2. The electronic device of claim 1, further comprising a multiplexing circuit coupled to receive the output detection signal generated by the output combining logic of each macropixel as input, and to pass at least one of the output detection signals as output.

3. The electronic device of claim 1, wherein the selection circuitry further comprises:
   a first AND gate coupled to receive the detection signal and a first control signal, and providing output to the output combining logic; and
   a second AND gate coupled to receive the detection signal and a second control signal, and providing output to the output combining logic of the at least one neighboring macropixel;
   wherein assertion of the first control signal indicates that the detection signal is to be passed to the output combining logic, and wherein assertion of the second control signal indicates that the detection signal is to be passed to the output combining logic of the at least one neighboring macropixel.

4. The electronic device of claim 1, wherein the output combining logic has inputs coupled to the selection circuitry, to the selection circuitry of a neighboring macropixel to the left, and to the selection circuitry of a neighboring macropixel to the right, and is configured to generate an output detection signal as a function of logically combining outputs of the selection circuitry, the selection circuitry of the neighboring macropixel to the left, and the selection circuitry of the neighboring macropixel to the right.

5. The electronic device of claim 4, wherein the selection circuitry comprises:

a first AND gate coupled to receive the detection signal and a first control signal, and providing output to the output combining logic;

a second AND gate coupled to receive the detection signal and a second control signal, and providing output to the output combining logic of the neighboring macropixel to the left; and a third AND gate coupled to receive the detection signal and a third control signal, and providing output to the output combining logic of the neighboring macropixel to the right;

wherein assertion of the first control signal indicates that the detection signal is to be passed to the output combining logic, wherein assertion of the second control signal indicates that the detection signal is to be passed to the output combining logic of the neighboring macropixel to the left, and wherein assertion of the third control signal indicates that the detection signal is to be passed to the output combining logic of the neighboring macropixel to the right.

6. The electronic device of claim 5, wherein the output combining logic comprises OR logic circuitry configured to receive outputs of the first AND gate, the selection circuitry of the neighboring macropixel to the left, and the selection circuitry of the neighboring macropixel to the right, and to generate the output detection signal as a function of a logic OR operation between the outputs of the first AND, the selection circuitry of the neighboring macropixel to the left, and the selection circuitry of the neighboring macropixel to the right.

7. The electronic device of claim 1, wherein the output combining logic has inputs coupled to the selection circuitry, to the selection circuitry of a neighboring macropixel above, and to the selection circuitry of a neighboring macropixel below, and is configured to generate an output detection signal as a function of logically combining outputs of the selection circuitry, the selection circuitry of the neighboring macropixel above, and the selection circuitry of the neighboring macropixel below.

8. The electronic device of claim 7, wherein the selection circuitry comprises:

a first AND gate coupled to receive the detection signal and a first control signal, and providing output to the output combining logic;

a second AND gate coupled to receive the detection signal and a second control signal, and providing output to the output combining logic of the neighboring macropixel above; and a third AND gate coupled to receive the detection signal and a third control signal, and providing output to the output combining logic of the neighboring macropixel below;

wherein assertion of the first control signal indicates that the detection signal is to be passed to the output combining logic, wherein assertion of the second control signal indicates that the detection signal is to be passed to the output combining logic of the neighboring macropixel above, and wherein assertion of the third control signal indicates that the detection signal is to be passed to the output combining logic of the neighboring macropixel below.

9. The electronic device of claim 8, wherein the output combining logic comprises OR logic circuitry configured to receive outputs of the first AND gate, the selection circuitry of the neighboring macropixel above, and the selection circuitry of the neighboring macropixel below, and to generate the output detection signal as a function of a logic OR operation between the outputs of the first AND, the selection circuitry of the neighboring macropixel above, and the selection circuitry of the neighboring macropixel below.

10. The electronic device of claim 1, wherein the selection circuitry comprises:

horizontal selection circuitry configured to selectively pass the detection signal to the output combining logic or to output combining logic of at least one horizontally neighboring macropixel of the plurality thereof; and vertical selection circuitry configured to selectively pass the detection signal to the output combining logic or to output combining logic of at least one vertically neighboring macropixel of the plurality thereof.

11. The electronic device of claim 10, wherein the output combining logic comprises:

horizontal combining logic having inputs coupled to the selection circuitry and to the selection circuitry of the at least one horizontally neighboring macropixel, and is configured to generate an output detection signal as a function of logically combining outputs of the selection circuitry and the selection circuitry of the at least one horizontally neighboring macropixel; and vertical combining logic having inputs coupled to the selection circuitry and to the selection circuitry of the at least one vertically neighboring macropixel, and is configured to generate an output detection signal as a function of logically combining outputs of the selection circuitry and the selection circuitry of the at least one vertically neighboring macropixel.

12. The electronic device of claim 11, further comprising: a multiplexing circuit coupled to receive the output detection signal generated by the vertical combining logic of each macropixel as input, and to pass at least one of those output detection signals as output.

13. The electronic device of claim 10, wherein the at least one photodetection block comprises an array of photodetection blocks; wherein the vertical selection circuitry of each macropixel is physically located at a periphery of the array of photodetection blocks; and wherein the horizontal selection circuitry of each macropixel is not physically located at a periphery of the array of photodetecton blocks.

14. The electronic device of claim 1, wherein the at least one photodetection block comprises an array of photodetection blocks; and wherein the selection circuitry and output combining circuitry is physically located at a periphery of the array of photodetection blocks.

15. An electronic device, comprising:

at least one photodetection block:

wherein the at least one photodetection block comprises a plurality of macropixels arranged into an array, each macropixel comprising:

circuitry dedicated to that macropixel and configured to generate a detection signal indicative of only whether that macropixel detected incoming light, if the circuitry is enabled; and selection circuitry configured to pass the detection signal to output combining logic;

wherein the output combining logic is configured to generate an output detection signal as a function of logically combining outputs of the selection circuitry and selection circuitry of at least one other macropixel.

16. The electronic device of claim 15, wherein the output combining logic is configured to generate the output detection signal as a function of logically combining outputs of the selection circuitry, selection circuitry of a neighboring macropixel to the left, and selection circuitry of the neighboring macropixel to the right.

17. The electronic device of claim 16, wherein the selection circuitry is configured to pass the detection signal to the output combining logic in response to a first control signal, to pass the detection signal to output combining logic of the neighboring macropixel to the left in response to a second control signal, and to pass the detection signal to output combining logic of the neighboring macropixel to the right in response to a third control signal.

18. The electronic device of claim 16, wherein the output combining logic comprises logic circuitry configured to receive outputs of the selection circuitry of the neighboring macropixel to the left, and the selection circuitry of the neighboring macropixel to the right, and to generate the output detection signal as a function of a logical operation between outputs of the selection circuitry of the neighboring macropixel to the left, and outputs of the selection circuitry of the neighboring macropixel to the right.

19. The electronic device of claim 15, wherein the selection circuitry comprises:
horizontal selection circuitry configured to selectively pass the detection signal to the output combining logic or to output combining logic of at least one horizontally neighboring macropixel of the plurality thereof; and
vertical selection circuitry configured to selectively pass the detection signal to the output combining logic or to output combining logic of at least one vertically neighboring macropixel of the plurality thereof.

20. The electronic device of claim 19, wherein the output combining logic comprises:
horizontal combining logic having inputs coupled to the selection circuitry and to the selection circuitry of the at least one horizontally neighboring macropixel, and is configured to generate an output detection signal as a function of logically combining outputs of the selection circuitry and the selection circuitry of the at least one horizontally neighboring macropixel; and
vertical combining logic having inputs coupled to the selection circuitry and to the selection circuitry of the at least one vertically neighboring macropixel, and is configured to generate an output detection signal as a function of logically combining outputs of the selection circuitry and the selection circuitry of the at least one vertically neighboring macropixel.

21. The electronic device of claim 20, further comprising: a multiplexing circuit coupled to receive the output detection signal generated by the vertical combining logic of each macropixel as input, and to pass at least one of those output detection signals as output.

22. The electronic device of claim 19, wherein the at least one photodetection block comprises an array of photodetection blocks; and wherein the vertical selection circuitry of each macropixel is physically located at a periphery of the array of photodetection blocks.

* * * * *